(12) United States Patent
Watanabe

(10) Patent No.: US 9,679,652 B2
(45) Date of Patent: Jun. 13, 2017

(54) THRESHOLD BASED MULTI-LEVEL CELL PROGRAMMING FOR RELIABILITY IMPROVEMENT

(71) Applicant: PHISON ELECTRONICS CORP., Miaoli (TW)

(72) Inventor: Hiroshi Watanabe, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 108 days.

(21) Appl. No.: 14/702,770

(22) Filed: May 4, 2015

(65) Prior Publication Data

US 2016/0329103 A1 Nov. 10, 2016

(51) Int. Cl.
  *G11C 16/14* (2006.01)
  *G11C 16/10* (2006.01)
  *G11C 16/04* (2006.01)
  *G11C 11/56* (2006.01)

(52) U.S. Cl.
  CPC .......... *G11C 16/10* (2013.01); *G11C 11/5628* (2013.01); *G11C 16/0483* (2013.01); *G11C 2211/5641* (2013.01)

(58) Field of Classification Search
  CPC .................................................. G11C 16/0483
  USPC ........................................ 365/185.14, 28, 29
  See application file for complete search history.

(56) References Cited

U.S. PATENT DOCUMENTS

| 5,043,940 | A | * | 8/1991 | Harari | H01L 27/11519 |
| | | | | | 257/E21.209 |
| 6,064,591 | A | * | 5/2000 | Takeuchi | G06F 11/1072 |
| | | | | | 365/168 |
| 7,518,911 | B2 | * | 4/2009 | Kamei | G11C 11/5628 |
| | | | | | 365/185.03 |
| 7,619,920 | B2 | * | 11/2009 | Shiga | G11C 8/08 |
| | | | | | 365/185.03 |
| 7,821,827 | B2 | * | 10/2010 | Kim | G11C 11/5628 |
| | | | | | 365/185.03 |
| 8,479,080 | B1 | * | 7/2013 | Shalvi | G06F 11/10 |
| | | | | | 365/185.09 |
| 2006/0155919 | A1 | * | 7/2006 | Lasser | G11C 11/5621 |
| | | | | | 711/103 |
| 2008/0195900 | A1 | * | 8/2008 | Chang | G11C 7/1006 |
| | | | | | 714/718 |
| 2009/0046509 | A1 | * | 2/2009 | Annavajjhala | G11C 11/5628 |
| | | | | | 365/185.03 |
| 2010/0254189 | A1 | * | 10/2010 | Cho | G11C 11/5628 |
| | | | | | 365/185.03 |
| 2010/0287447 | A1 | * | 11/2010 | Eun | G06F 11/1068 |
| | | | | | 714/763 |
| 2011/0096601 | A1 | * | 4/2011 | Gavens | G11C 11/5628 |
| | | | | | 365/185.09 |

(Continued)

*Primary Examiner* — Alexander Sofocleous
*Assistant Examiner* — Mushfique Siddique
(74) *Attorney, Agent, or Firm* — Jianq Chyun IP Office

(57) ABSTRACT

A memory management method, a memory storage device and a memory controlling circuit unit are provided. The method comprises: obtaining an erased state voltage of a first memory cell and a programmed state voltage of the first memory cell, where the first memory cell is operated in a first programming mode; and operating the first memory cell in a second programming mode if a width of a gap between the erased state voltage and the programmed state voltage is larger than a first threshold value. Accordingly, the reliability of the first memory cell may be improved.

21 Claims, 11 Drawing Sheets

(56) References Cited

U.S. PATENT DOCUMENTS

| | | | |
|---|---|---|---|
| 2011/0126080 A1* | 5/2011 | Wan | G11C 11/5628 714/763 |
| 2012/0284574 A1* | 11/2012 | Avila | G11C 16/28 714/704 |
| 2013/0028018 A1* | 1/2013 | Cho | G11C 11/5628 365/185.03 |
| 2014/0050024 A1* | 2/2014 | Shirota | G11C 16/26 365/185.03 |
| 2014/0293696 A1* | 10/2014 | Lin | G11C 16/26 365/185.12 |
| 2014/0325118 A1* | 10/2014 | Cheng | G06F 12/0246 711/103 |
| 2015/0095741 A1* | 4/2015 | Lin | G06F 11/1048 714/773 |

* cited by examiner

THRESHOLD BASED MULTI-LEVEL CELL PROGRAMMING FOR RELIABILITY IMPROVEMENT

BACKGROUND

Technical Field

The invention relates to a memory management method, and more particularly, relates to a memory management method, a memory storage device and a memory controlling circuit unit for a rewritable non-volatile memory module.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, when using time and/or accessing count of the rewritable non-volatile memory module increases, data read from the memory cells in the rewritable non-volatile memory module may contains more and more error bits. A data correction operation may be performed to correct those error bits. However, the data correction operation usually costs a lot of time.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a memory management method, a memory storage device, and a memory controlling circuit unit, which are capable of reducing the error bits contained in data read from the rewritable non-volatile memory module.

A memory management method for a rewritable non-volatile memory module comprising a plurality of memory cells, and the memory management method comprising: obtaining an erased state voltage of a first memory cell among the memory cells and a programmed state voltage of the first memory cell, wherein the first memory cell is operated in a first programming mode; and operating the first memory cell in a second programming mode if a width of a gap between the erased state voltage and the programmed state voltage is larger than a first threshold value, wherein a second number of a plurality of second states of the first memory cell operated in the second programming mode is less or equal to a first number of a plurality of first states of the first memory cell operated in the first programming mode.

A memory storage device according to another exemplary embodiment of the invention is provided. The memory storage device comprises a connection interface unit, a rewritable non-volatile memory module and a memory controlling circuit unit. The connection interface unit is configured to couple to a host system. The rewritable non-volatile memory module comprises a plurality of memory cells. The memory controlling circuit unit is coupled to the connection interface unit and the rewritable non-volatile memory module, wherein the memory controlling circuit unit is configured to obtain an erased state voltage of a first memory cell among the memory cells and a programmed state voltage of the first memory cell, wherein the first memory cell is operated in a first programming mode, wherein the memory controlling circuit unit is further configured to operate the first memory cell in a second programming mode if a width of a gap between the erased state voltage and the programmed state voltage is larger than a first threshold value, wherein a second number of a plurality of second states of the first memory cell operated in the second programming mode is less or equal to a first number of a plurality of first states of the first memory cell operated in the first programming mode.

A memory controlling circuit unit configured to control a rewritable non-volatile memory module according to another exemplary embodiment of the invention is provided. The memory controlling circuit unit comprises a host interface, a memory interface and a memory management circuit. The host interface is configured to couple to a host system. The memory interface is configured to couple to the rewritable non-volatile memory module, wherein the rewritable non-volatile memory module comprises a plurality of memory cells. The memory management circuit is coupled to the host interface and the memory interface, wherein the memory management circuit is configured to obtain an erased state voltage of a first memory cell among the memory cells and a programmed state voltage of the first memory cell, wherein the first memory cell is operated in a first programming mode, wherein the memory management circuit is further configured to operate the first memory cell in a second programming mode if a width of a gap between the erased state voltage and the programmed state voltage is larger than a first threshold value, wherein a second number of a plurality of second states of the first memory cell operated in the second programming mode is less or equal to a first number of a plurality of first states of the first memory cell operated in the first programming mode.

Based on the above, a specific programming mode is determined and configured to operate a specific memory cell according to the erased state voltage and the programmed state voltage of the specific memory cell. Accordingly, error bits contained in data read from the specific memory cell may be reduced and the lifetime of the rewritable non-volatile memory module may be extended.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are comprised to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
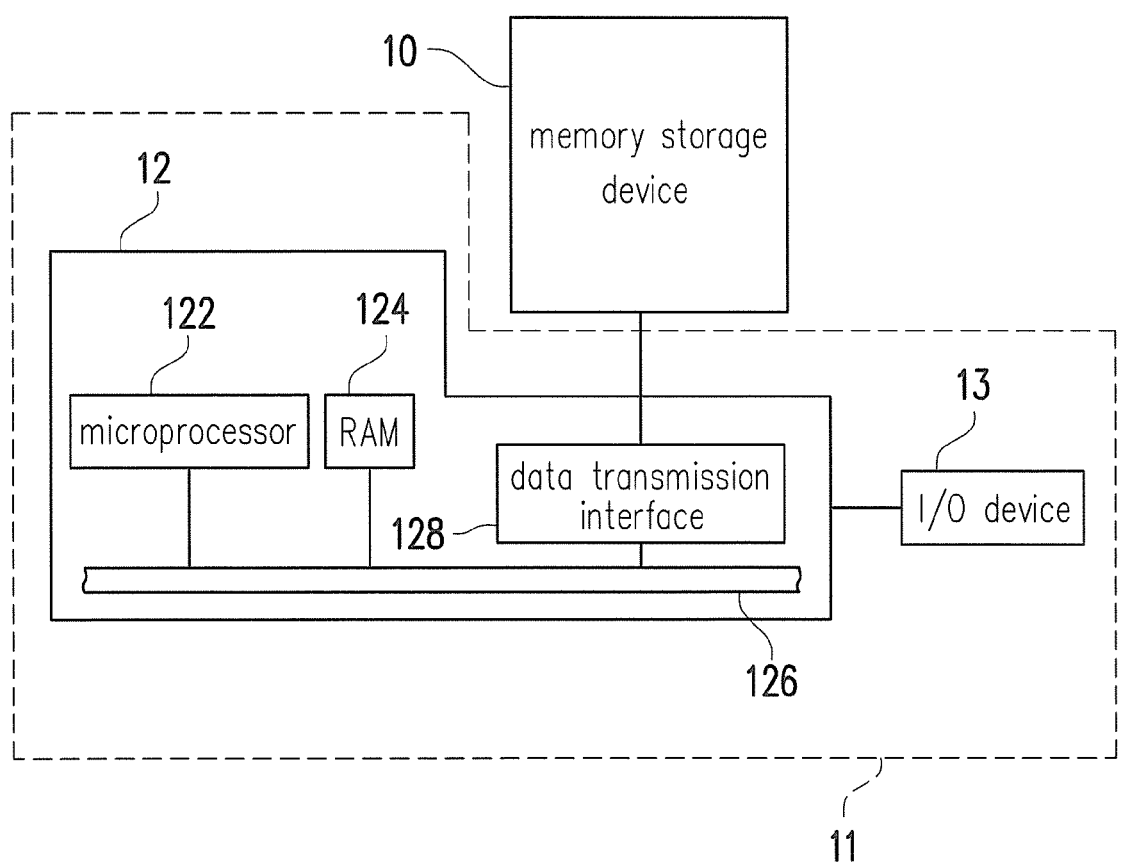
FIG. 1 is a schematic diagram illustrating a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more," and "and/or" are open-ended expressions that are both conjunctive and disjunctive in operation. For example, each of the expressions "at least one of A,B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) comprises a rewritable non-volatile memory module and a controller (also known as a control circuit). The memory storage device is usually configured together with a host system so that the host system may write data to or read data from the memory storage device.

Figure 2:
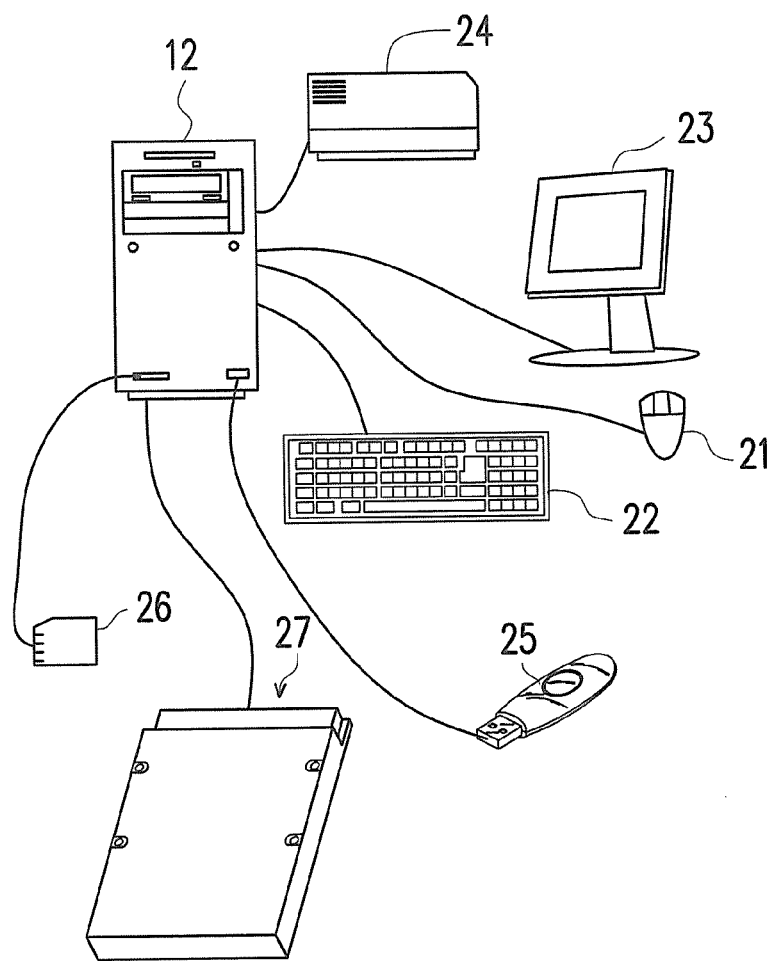
FIG. 2 is a schematic diagram of a computer, an input/output device, and a memory storage device according to an exemplary embodiment of the invention.

FIG. 1 is a schematic diagram illustrating a host system and a memory storage device according to an exemplary embodiment of the invention. FIG. 2 is a schematic diagram of a computer, an input/output device, and a memory storage device according to an exemplary embodiment of the invention.

Referring to FIG. 1, a host system 11 comprises a computer 12 and an input/output (I/O) device 13. The computer 12 comprises a microprocessor 122, a random access memory (RAM) 124, a system bus 126, and a data transmission interface 128. For example, the I/O device 13 comprises a mouse 21, a keyboard 22, a display 23 and a printer 24 as shown in FIG. 2. It should be understood that the devices illustrated in FIG. 2 are not intended to limit the I/O device 13, and the I/O device 13 may further comprise other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
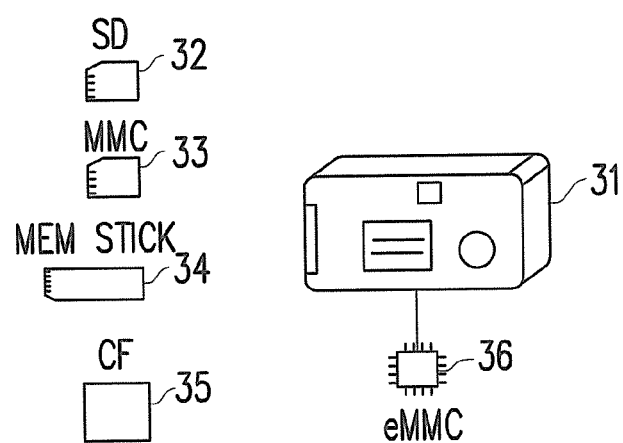
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 11 may be any system capable of substantially cooperating with the memory storage device 10 for storing data. In the present exemplary embodiment, the host system 11 is illustrated as a computer system. However, in another exemplary embodiment, the host system 11 may be a system such as a digital camera, a video camera, a telecommunication device, an audio player, or a video player. For example, when the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 comprises an embedded MMC (eMMC). It should be mentioned that the eMMC is directly coupled to a substrate of the host system.

Figure 4:
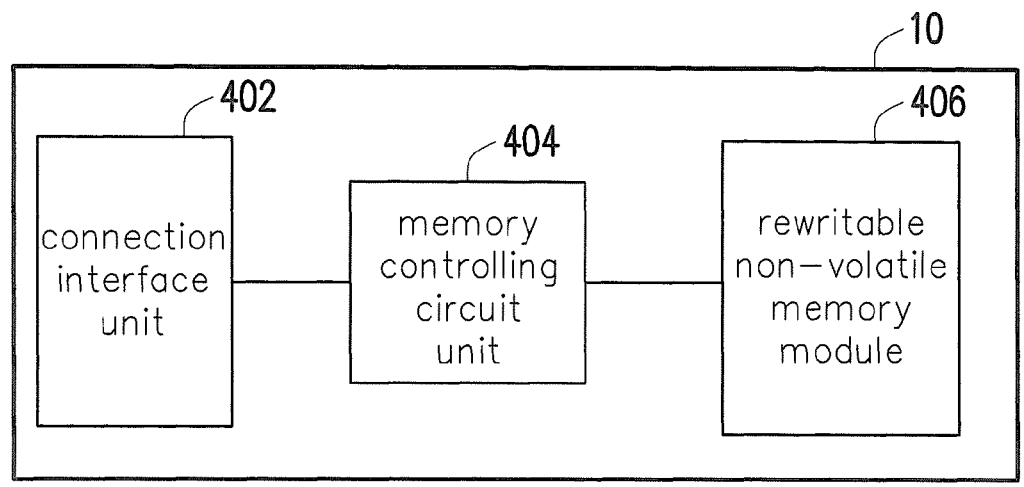
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a serial advanced technology attachment (SATA) standard. However, the invention is not limited thereto, and the connection interface unit 402 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form, so as to execute operations of writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 may be a NAND flash memory module, a NOR flash memory module or other type of flash memory module.

Figure 5:
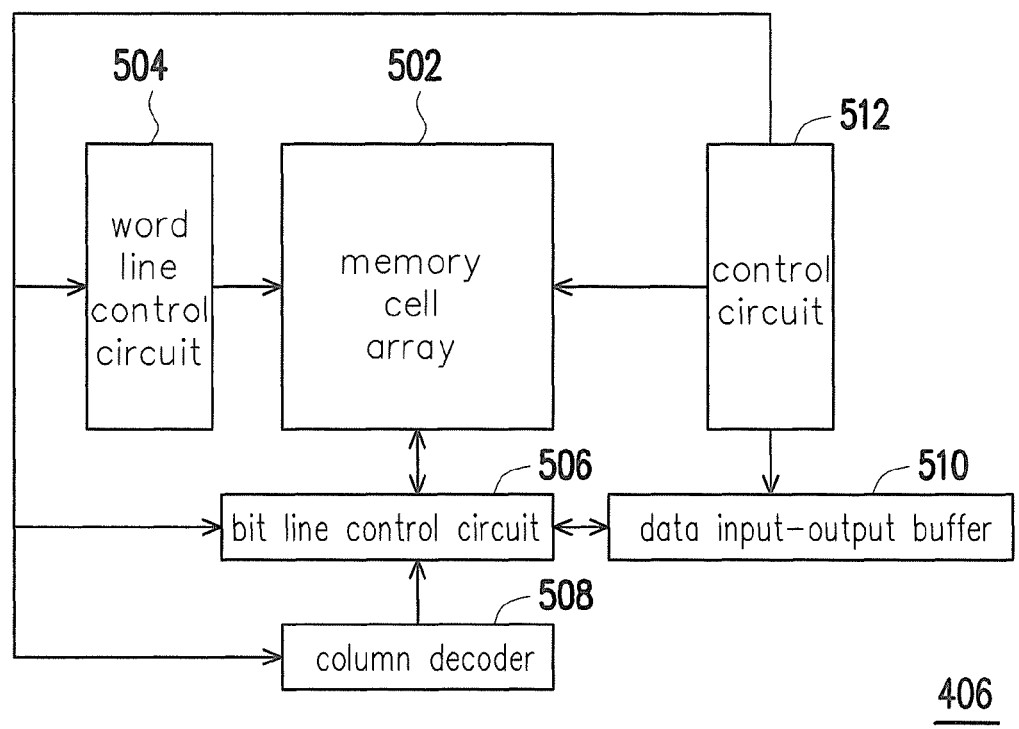
FIG. 5 is a schematic block diagram illustrating a rewritable non-volatile memory module according to an exemplary embodiment of the invention.
Figure 6:
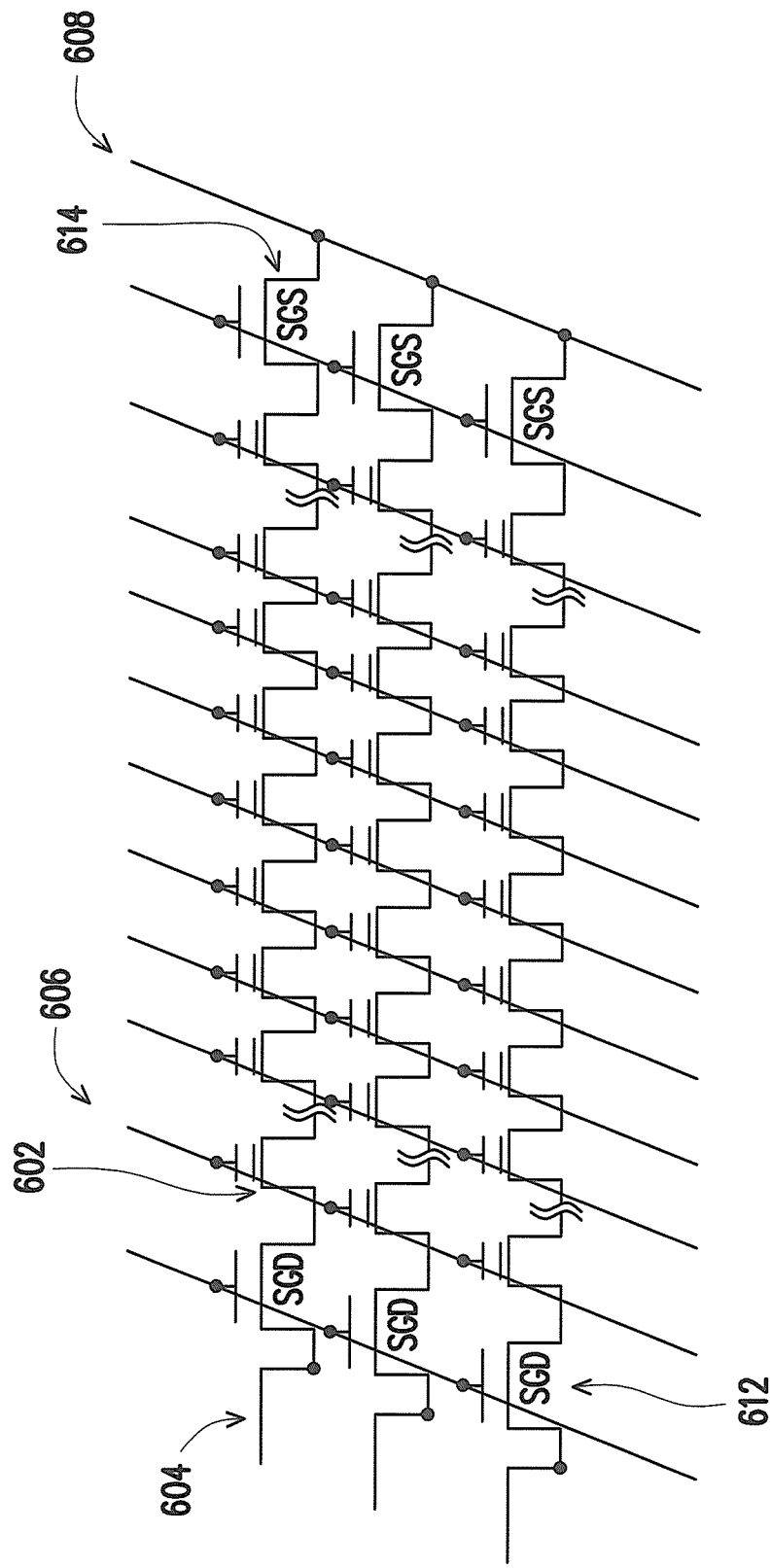
FIG. 6 is a schematic diagram illustrating a memory cell array according to an exemplary embodiment of the invention.

FIG. 5 is a schematic block diagram illustrating a rewritable non-volatile memory module according to an exemplary embodiment of the invention. FIG. 6 is a schematic diagram illustrating a memory cell array according to an exemplary embodiment of the invention.

Referring to FIG. 5, the rewritable non-volatile memory module 406 includes a memory cell array 502, a word line control circuit 504, a bit line control circuit 506, a column decoder 508, a data input-output buffer 510 and a control circuit 512.

In the present exemplary embodiment, the memory cell array 502 may include a plurality of memory cells 602 used to store data, a plurality of select gate drain (SGD) transistors 612, a plurality of select gate source (SGS) transistors 614, as well as a plurality of bit lines 604, a plurality of word lines 606, a common source line 608 connected to the memory cells (as shown in FIG. 6). The memory cell 602 is disposed at intersections of the bit lines 604 and the word lines 606 in a matrix manner (or in a 3D stacking manner). When a write command or a read command is received from the memory controlling circuit unit 404, the control circuit 512 controls the word line control circuit 504, the bit line control circuit 506, the column decoder 508, the data input-output buffer 510 to write the data into the memory cell array 502 or read the data from the memory cell array 502. Among them, the word line control circuit 504 is configured to control voltages applied to the word lines 606; the bit line control circuit 506 is configured to control voltages applied to the bit lines 604; the column decoder 508 is configured to select the corresponding bit line according to a row address in a command; and the data input-output buffer 510 is configured to temporarily store the data.

Each of the memory cells in the rewritable non-volatile memory module 406 may store one or more bits by changing a threshold voltage of the memory cell. More specifically, in each of the memory cells, a charge storage layer is provided between a control gate and a channel. Amount of electrons in the charge storage layer may be changed by applying a write voltage to the control gate thereby changing the threshold voltage of the memory cell. This process of changing the threshold voltage is also known as "writing data into the memory cell" or "programming the memory cell." Each of the memory cells in the memory cell array 502 has a plurality of storage statuses (also known as "states") depended on changes in the threshold voltage. Moreover, to which the storage statuses that the memory cell belongs may be determined by applying read voltages, so as to obtain the bit data stored in the memory cell. In the present exemplary embodiment, the charge storage layer of each of the memory cell may be a floating gate or a charge trapping layer.

Figure 7:
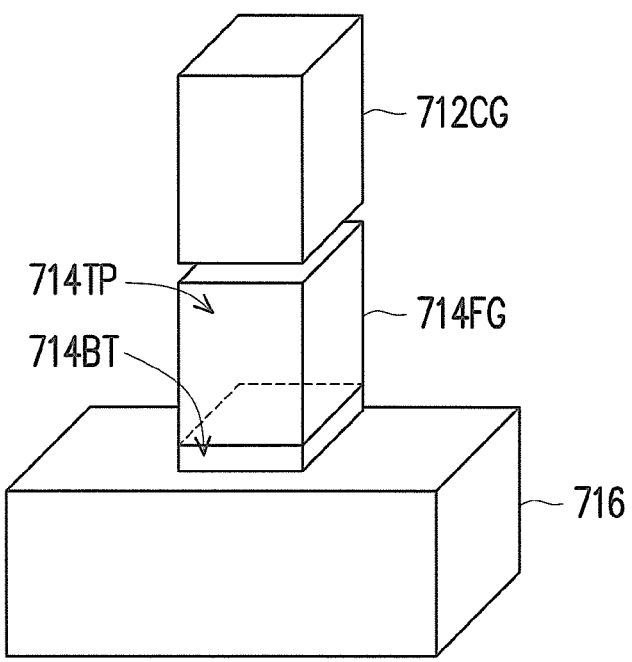
FIG. 7 is a schematic block diagram illustrating a floating gate memory cell according to an exemplary embodiment of the invention.

FIG. 7 is a schematic block diagram illustrating a floating gate memory cell according to an exemplary embodiment of the invention.

Referring to FIG. 7, a floating gate memory cell may comprise a control gate 712CG, a floating gate 714FG and a P-type substrate (or Well) 716. When the control gate 712CG is positively biased and the P-type substrate (or Well) 716 is grounded, the top surface 714TP of the floating gate 714FG is negatively charged and the bottom surface 714BT of the floating gate 714FG is positively charged. In this case, the theoretical limit of stored charge in the floating gate memory cell is $qN_D \times H$, where q is the elementary charge, $N_D$ is the donor density of floating gate 614FG, and H is the height of floating gate. However, the theoretical limit is not the "actual" limit, and some irregular issues may push the stored charge to be out of this limitation.

Figure 8:
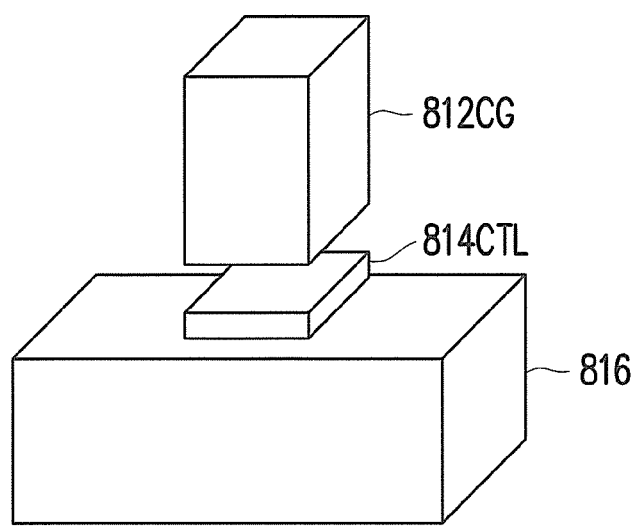
FIG. 8 is a schematic block diagram illustrating a charge trapping layer memory cell according to an exemplary embodiment of the invention.

FIG. 8 is a schematic block diagram illustrating a charge trapping layer memory cell according to an exemplary embodiment of the invention.

Referring to FIG. 8, a charge trapping layer memory cell may comprise a control gate 812CG, a charge trapping layer 814CTL and a P-type substrate (or Well) 816. In this case, the theoretical limit of stored charge in the charge trapping layer memory cell is $qN_t$, where $N_t$ is the trap density of charge trapping layer 814CTL. However, the theoretical limit is also not the "actual" limit, and some irregular issues may push the stored charge to be out of this limitation.

Figure 9:
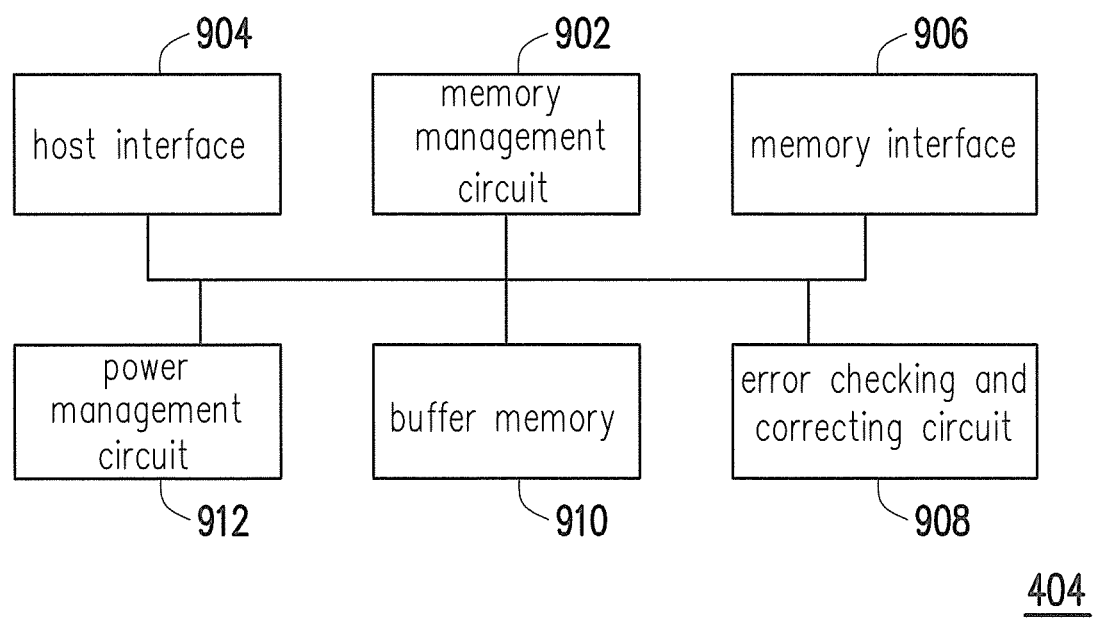
FIG. 9 is a schematic block diagram illustrating a memory controlling circuit unit according to an exemplary embodiment of the invention.

FIG. 9 is a schematic block diagram illustrating a memory controlling circuit unit according to an exemplary embodiment of the invention.

Referring to FIG. 9, the memory controlling circuit unit 404 includes a memory management circuit 902, a host interface 904, a memory interface 906 and an error checking and correcting circuit 908.

The memory management circuit 902 is configured to control overall operations of the memory controlling circuit unit 404. Specifically, the memory management circuit 902 has a plurality of control commands. During operations of the memory storage device 10, the control commands are executed to execute various operations such as writing, reading and erasing data. Operations of the memory management circuit 902 are similar to the operations of the memory controlling circuit unit 404, thus related description is omitted hereinafter.

In the present exemplary embodiment, the control commands of the memory management circuit 902 are implemented in a form of a firmware. For instance, the memory management circuit 902 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 902 may also be stored as program codes in a specific area (for example, the system area in a memory exclusively used for storing system data) of the rewritable non-volatile memory module 406. In addition, the memory management circuit 902 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 902 when the memory controlling circuit unit 404 is enabled. Thereafter, the control commands are executed by the microprocessor unit to perform operations of writing, reading or erasing data.

Further, in another exemplary embodiment, the control commands of the memory management circuit 902 may also be implemented in a form of hardware. For example, the memory management circuit 902 includes a microcontroller, a memory writing circuit, a memory reading circuit, a memory erasing circuit and a data processing circuit. The memory writing circuit, the memory reading circuit, the memory erasing circuit and the data processing circuit are coupled to the microprocessor. The memory writing circuit is configured to issue a write command to the rewritable non-volatile memory module 406 in order to write data to the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written to the rewritable non-volatile memory module 406 and the data to be read from the rewritable non-volatile memory module 406.

The host interface 904 is coupled to the memory management circuit 902 and configured to receive and identify commands and data sent from the host system 11. In other words, the commands and data sent from the host system 11 are passed to the memory management circuit 902 through the host interface 904. In the present exemplary embodiment, the host interface 904 is compatible with a SATA standard. However, it should be understood that the present invention is not limited thereto, and the host interface 904 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 906 is coupled to the memory management circuit 902 and configured to access the rewritable non-volatile memory module 406. That is, data to be written to the rewritable non-volatile memory module 406 is converted to a format acceptable to the rewritable non-volatile memory module 406 through the memory interface 906. Specifically, if the memory management circuit 902 intends to access the rewritable non-volatile memory module 406, the memory interface 906 sends corresponding command sequences. The command sequences may include one or more signals, or data from the bus. For example, in a read command sequence, information such as identification codes and memory addresses are included.

The error checking and correcting circuit 908 is coupled to the memory management circuit 902 and configured to execute an error checking and correcting process to ensure the correctness of data. Specifically, when the memory management circuit 902 receives the writing command from the host system 11, the error checking and correcting circuit 908 generates an error correcting code (ECC) and/or an error detecting code (EDC) for data corresponding to the writing command, and the memory management circuit 902 writes data and the ECC and/or the EDC corresponding to the writing command to the rewritable non-volatile memory module 406. Subsequently, when the memory management circuit 902 reads the data from the rewritable non-volatile memory module 406, the corresponding ECC and/or the EDC is also read from the rewritable non-volatile memory module 406, and the error checking and correcting circuit 908 executes the error checking and correcting process for the read data based on the ECC and/or the EDC.

In an exemplary embodiment, the memory controlling circuit unit 404 further includes a buffer memory 910 and a power management circuit 912. The buffer memory 910 is coupled to the memory management circuit 902 and configured to temporarily store data and commands from the host system 11 or data from the rewritable non-volatile memory module 406. The power management unit 912 is coupled to the memory management circuit 902 and configured to control a power of the memory storage device 10.

The memory cells of the rewritable non-volatile memory module 406 constitute a plurality of physical programming units, and the physical programming units constitute a plurality of physical erasing units. Specifically, the memory cells on the same word line constitute one or more physical programming units. If each of the memory cells can store more than two bits, the physical programming units on the same word line can be at least classified into a lower physical programming unit and an upper physical programming unit. Generally, a writing speed of the lower physical programming unit is faster than a writing speed of the upper physical programming unit, or a reliability of the lower physical programming unit is higher than a reliability of the upper physical programming unit.

In the present exemplary embodiment, the physical programming unit is a minimum unit for programming. That is, the physical programming unit is the minimum unit for writing data. For example, the physical programming unit is a physical page or a physical sector. If the physical programming unit is the physical page, the physical programming unit usually includes a data bit area and a redundancy bit area. The data bit area has multiple physical sectors configured to store user data, and the redundant bit area is configured to store system data (e.g., an error correcting code). In the present exemplary embodiment, the data bit area contains 32 physical sectors, and a size of each physical sector is 512-byte (B). However, in another exemplary embodiment, the data bit area may also include 8, 16, or more or less of the physical sectors, and an amount and a size of the physical sectors are not limited in the invention. On the other hand, the physical erasing unit is the minimal unit for erasing. Namely, each physical erasing unit contains the least number of memory cells to be erased together. For instance, the physical erasing unit is a physical block.

Figure 10:
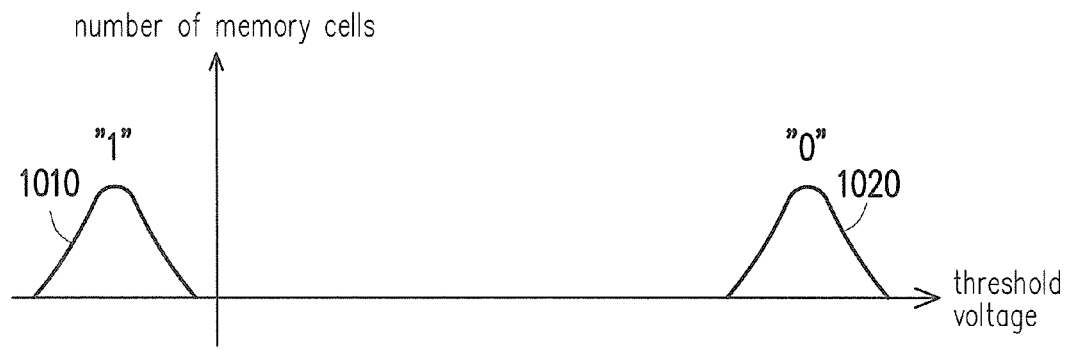
FIG. 10 is a schematic block diagram illustrating a threshold voltage distribution of memory cells according to an exemplary embodiment of the invention.

FIG. 10 is a schematic block diagram illustrating a threshold voltage distribution of memory cells according to an exemplary embodiment of the invention.

Referring to FIG. 10, after data is written into plural memory cells, the threshold voltage distribution of those memory cells includes two states 1010 and 1020. The states 1010 and 1020 represents bit "1" and "0," respectively. For example, the state 1010 with lower voltage peak represents bit "1," and the state 1020 with higher voltage peak represents bit "0." By applying a read voltage between the states 1010 and 1020 to the memory cells, the data stored in the memory cells may be obtained. For example, responding to the read voltage, a memory cell with threshold voltage lower than the read voltage may be identified as storing bit "1," and anther memory cell with threshold voltage higher than the read voltage may be identified as storing bit "0." In the present exemplary embodiment, each of the memory cells including two states is also referred as being operated in a two level cell (2LC) programming mode. Each memory cell operated in the 2LC programming mode is configured to store one bit of data. However, in another exemplary embodiment, the state 1010 may represent bit "0," and the state 1020 may represent bit "1."

Figure 11:
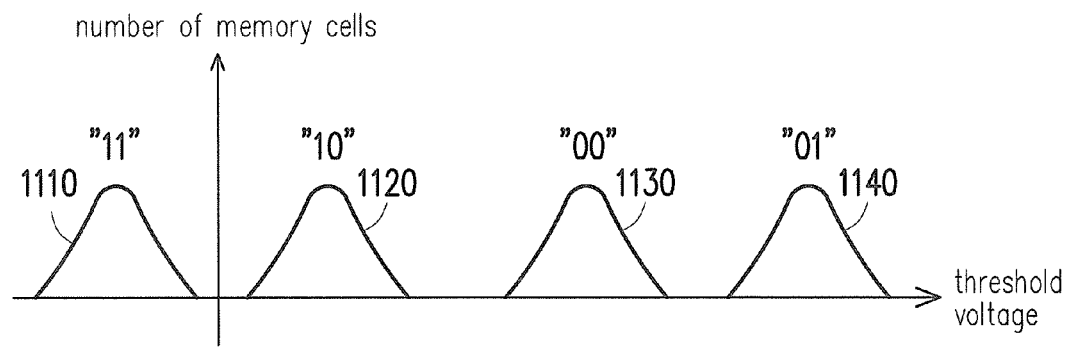
FIG. 11 is a schematic block diagram illustrating a threshold voltage distribution of memory cells according to another exemplary embodiment of the invention.

FIG. 11 is a schematic block diagram illustrating a threshold voltage distribution of memory cells according to another exemplary embodiment of the invention.

Referring to FIG. 11, after data is written into plural memory cells, the threshold voltage distribution of those memory cells includes four states 1110 to 1140. The states 1110 to 1140 represents bits "11," "10," "00" and "01," respectively. For example, the state 1110 represents bits "11," the state 1120 represents bits "10," the state 1130 represents bits "00," and the state 1140 represent bits "01." By applying different read voltages to the memory cells, the data stored in the memory cells may also be obtained. In the present exemplary embodiment, each of the memory cells including four states is also referred as being operated in a four level cell (4LC) programming mode. Each memory cell operated in the 4LC programming mode is configured to store two bits of data. However, the data represented by each of the states 1110 to 1140 may be different depending on different design.

Figure 12:
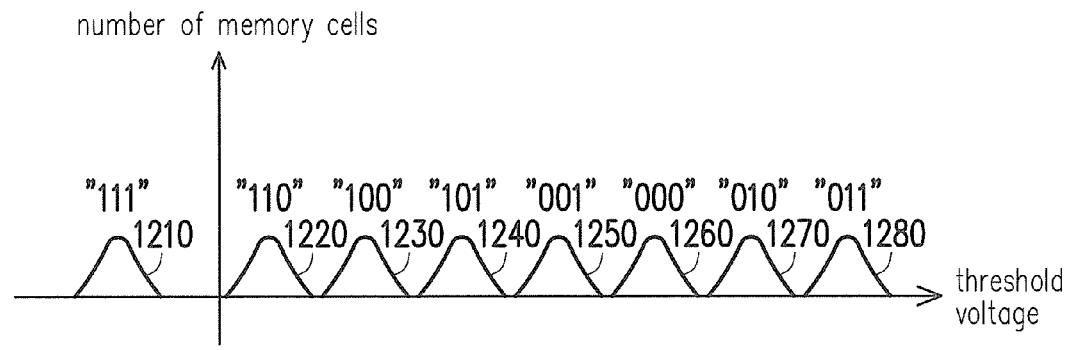
FIG. 12 is a schematic block diagram illustrating a threshold voltage distribution of memory cells according to another exemplary embodiment of the invention.

FIG. 12 is a schematic block diagram illustrating a threshold voltage distribution of memory cells according to another exemplary embodiment of the invention.

Referring to FIG. 12, after data is written into plural memory cells, the threshold voltage distribution of those memory cells includes eight states 1210 to 1280. The states 1210 to 1280 represents bits "111," "110," "100," "101," "001," "000," "010" and "011," respectively. By applying different read voltages to the memory cells, the data stored in the memory cells may also be obtained. In the present exemplary embodiment, each of the memory cells including eight states is also referred as being operated in an eight level cell (8LC) programming mode. Each memory cell operated in the 8LC programming mode is configured to store three bits of data. However, the data represented by each of the states 1210 to 1280 may be different depending on different design.

It is noted that, in another exemplary embodiment, the number of states of each memory cell may also be three, five, six, seven or more, which is not limited thereby. In other words, each memory cell may be operated in a M level cell (MLC) programming mode, where M may be any positive integer equal to or larger than two. If a specific memory cell is operated in an MLC programming mode, the specific memory cell has M states (or, peaks) in the corresponding threshold voltage distribution.

However, after memory cells are programmed and erased repeatedly (i.e., plural P/E cycles), each peak of the threshold voltage distribution of the memory cells may become degraded (i.e., flatter and wider), and the error in the data stored in those memory cells may increase.

Figure 13:
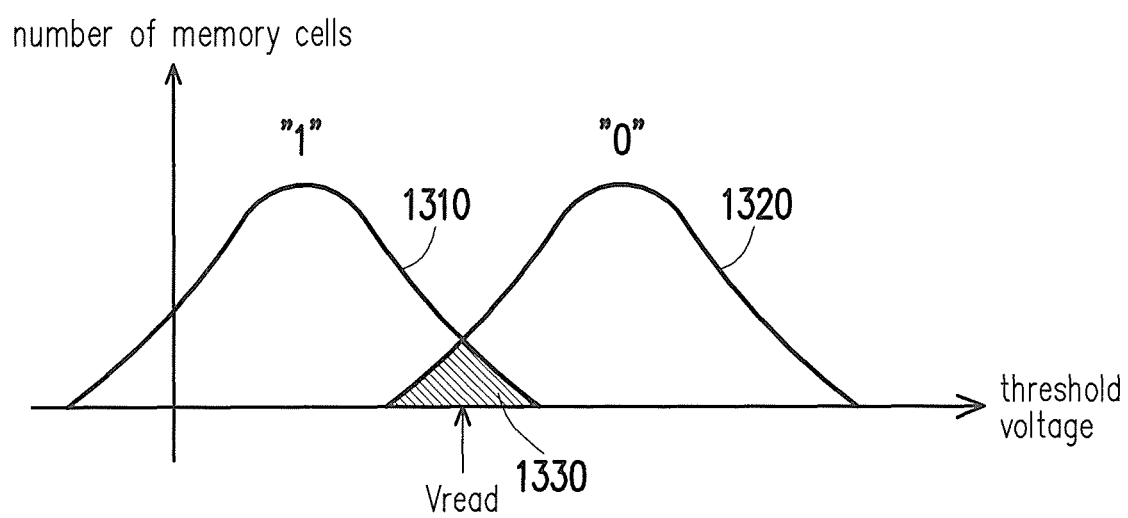
FIG. 13 is a schematic block diagram illustrating a degraded threshold voltage distribution; which is to be solved according to an exemplary embodiment of the invention.

FIG. 13 is a schematic block diagram illustrating a degraded threshold voltage distribution; which is to be solved according to an exemplary embodiment of the invention.

Referring to FIG. 13 which takes the degraded threshold voltage distribution of memory cells operated in 2LC programming mode as an example, the state 1310 representing bit "1"and the state 1320 representing bit "0" are partially overlapped. In the overlapped region 1330, a memory cell storing bit "1" may be misidentified as storing bit "0" because the threshold voltage of the memory cell is higher than the applied read voltage $V_{read}$; another memory cell storing bit "0" may be misidentified as storing bit "1" because the threshold voltage of the memory cell is lower than the applied read voltage $V_{read}$. That is, when applying the read voltage $V_{read}$ to read the data stored in those memory cells, many error may be included in the read data. Similar situation may occur in any two neighboring states shown in FIG. 11 and FIG. 12.

In the present exemplary embodiment, it is assumed that a memory cell (also known as a first memory cell) in the rewritable non-volatile memory module 406 is originally configured to be operated in a specific programming mode (also known as a first programming mode). For example, the first programming mode may be configured in the manufacturing process of the rewritable non-volatile memory module 406. The memory management circuit 902 obtains an erased state voltage of the first memory cell and a programmed state voltage of the first memory cell. Here, the erased state voltage is a most-erased state voltage of the first memory cell, and the programmed state voltage is a most-programmed state voltage of the first memory cell. In the present exemplary embodiment, the memory management circuit 902 may record the most-erased state voltage of the first memory cell when the first memory cell is in an erased state. The first memory cell in the erased state indicates that the first memory cell is erased and not used to store data. For example, the memory management circuit 902 may erase the first memory cell and then record the most-erased state voltage of the first memory cell. The memory management circuit 902 may record the most-programmed state voltage of the first memory cell when the first memory cell is in a programmed state. The first memory cell in the programmed state indicates that the first memory cell is programmed and data is stored in the first memory cell. For example, the memory management circuit 902 may program the first memory cell and then record the most-programmed state voltage of the first memory cell. If there are many states when the first memory cell is in the programmed state, the most-programmed state voltage is referred as the state with the highest threshold voltage of the first memory cell.

Taking the exemplary embodiments of FIG. 10 to FIG. 12 as examples, the most-erased state voltage of the first memory cell may be included in the state 1010, 1110 or 1210 depending on the adopted programming mode (i.e., the first programming mode) of the first memory cell, and the most-programmed state voltage of the first memory cell may be included in the state 1020, 1140 or 1280 depending on the adopted programming mode (i.e., the first programming mode) of the first memory cell. However, in another exemplary embodiment, the memory management circuit 902 may scan all or parts of the memory cells in the rewritable non-volatile memory module 406, so as to obtain the most-erased state voltage and the most-programmed state voltage of the scanned memory cells.

The memory management circuit 902 analyses the gap between the erased state voltage and the programmed state voltage and determines a programming mode for operating the first memory cell according to the width of the gap between the erased state voltage and the programmed state voltage. According to different widths of the gap, different programming modes may be determined and adopted. In some cases, the newly determined programming mode may also be the same with the first programming mode.

In the present exemplary embodiment, the memory management circuit 902 determines whether the width of the gap between the erased state voltage and the programmed state voltage is larger than a threshold value (also known as a first threshold value). If the width of the gap between the erased state voltage and the programmed state voltage is larger than the first threshold value, the memory management circuit 902 determines to operate the first memory cell in a programming mode (also known as a second programming mode). The second programming mode may be different from or the same with the first programming mode. The number (also known as a second number) of states (also known as the second states) of the first memory cell operated in the second programming mode is less than or equal to the number (also known as a first number) of states (also known as the first states) of the first memory cell operated in the first programming mode. However, if the gap between the erased state voltage and the programmed state voltage is not larger than the first threshold value, the memory management circuit 902 determines to operate the first memory cell in another programming mode (also known as a third programming mode). The third programming mode is different from the first programming mode and the second programming mode. The number (also known as a third number) of states (also known as the third states) of the first memory cell operated in the third programming mode is less than the second number.

In the present exemplary embodiment, if the width of the gap between the erased state voltage and the programmed state voltage is larger than the first threshold value, the memory management circuit 902 further determines whether the width of the gap is larger than another threshold value (also known as a second threshold value). The second threshold value is larger than the first threshold value. If the width of the gap is larger than the second threshold value, the memory management circuit 902 further determines to operate the first memory cell in another programming mode (also known as a fourth programming mode). The number (also known as a fourth number) of states (also known as the fourth states) of the first memory cell operated in the fourth programming mode is larger than the second number and less than or equal to the first number. However, if the width of the gap is larger than the first threshold value and less than the second threshold value, the first memory cell is maintained to be operated in the second programming mode. The threshold values adopted in the continuous determination operations may be increased gradually and corresponding determination operation may be performed until the width of the gap is located within two specific threshold values; and thereby a suitable programming mode may be determined and adopted for operating the first memory cell. In other words, when the gap between the erased state voltage of the first memory cell and the programmed state voltage of the first memory cell is too narrow, the first memory cell is determined to be operated in the programming mode with less states; when the gap between the erased state voltage of the first memory cell and the programmed state voltage of the first memory cell is wide enough, the first memory cell is determined to be operated in the programming mode with more states. Accordingly, the reliability of the first memory cell may be improved. In the present exemplary embodiment, each memory cell is operated in a corresponding programming mode, based on said gap of each memory cell. That is, at least two different memory cells in the same physical unit or different physical units may be operated in different programming mode. However, in another exemplary embodiment, when a programming mode corresponding to a specific memory cell is determined, all memory cells in a specific physical unit including the specific memory cell may be operated in a same programming mode. For example, the physical unit may be a physical sector, a physical programming unit or a physical erasing unit. Therefore, the lifetime of the memory storage device 10 may be prolonged.

Figure 14A:
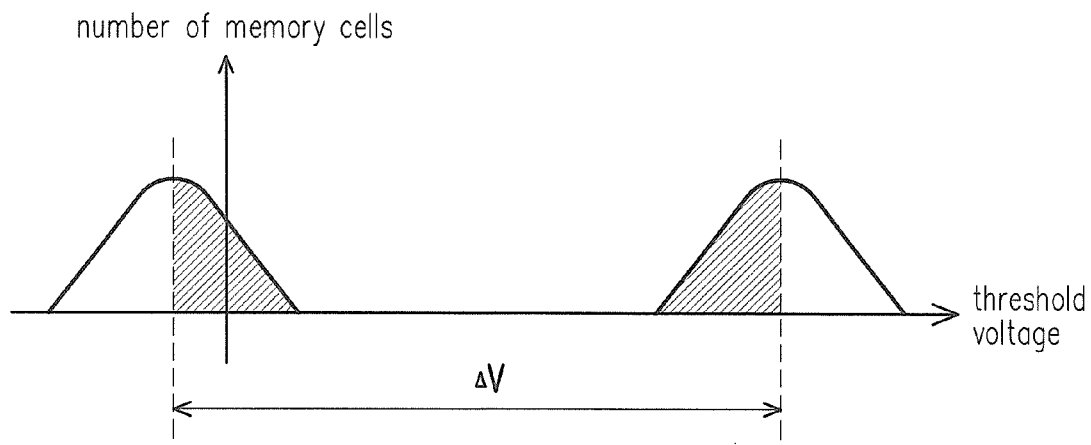
FIG. 14a to FIG. 14c are schematic block diagrams illustrating the operation of managing memory cells according to an exemplary embodiment of the invention.
Figure 14B:
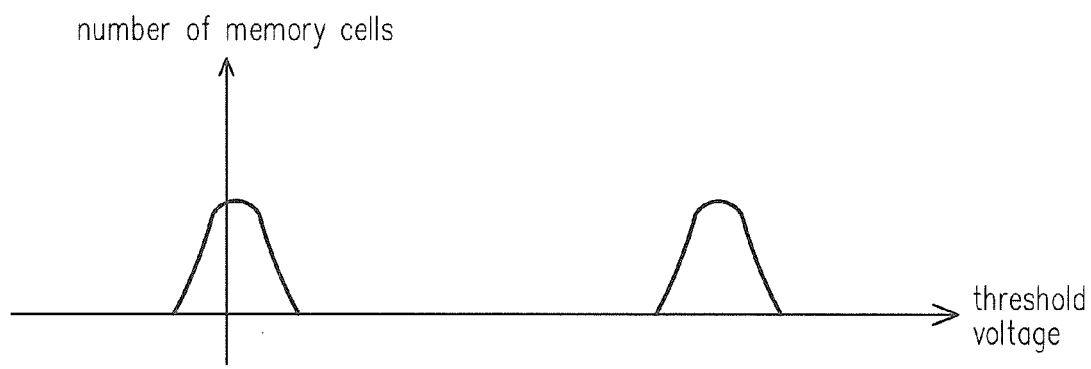
Figure 14C:
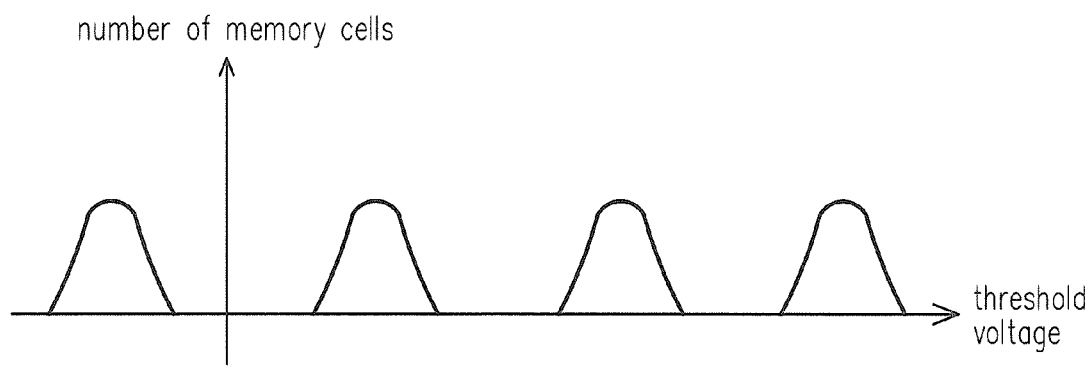

FIG. 14a to FIG. 14c are schematic block diagrams illustrating the operation of managing memory cells according to an exemplary embodiment of the invention.

Referring to FIG. 14a, it is assumed that some memory cells are originally designed to operate in the 4LC programming mode. After degradation occurs, the peaks of the threshold voltage distribution of those memory cells become flatter and wider. FIG. 14a shows, for example, the degraded erased state voltage and the degraded programmed state voltage of each memory cell. In the present exemplary embodiment, after performing the above operations of analyzing the gap between the erased state voltage and the programmed state voltage of each memory cell and assigning a specific programming mode to each memory cell, the memory cells with threshold voltages locating in the voltage range $\Delta V$ may be assigned to operate in the 2LC programming mode (shown as FIG. 14b) owing to said gaps of those memory cells are too narrow, while the memory cells with threshold voltages not locating in the voltage range $\Delta V$ may be maintained to be operated in the 4LC programming mode (shown as FIG. 14c). For example, in the present exemplary embodiment, the voltage range $\Delta V$ may be regarded as the first threshold value.

In an exemplary embodiment, the memory management circuit 902 further determines whether the width of the gap between the erased state voltage and the programmed state voltage is larger than a preset threshold value (also known as a first preset threshold value). The first preset threshold value is less than other threshold values for comparing with said gap in the above exemplary embodiments. The memory management circuit 902 further determines to operate the first memory cell in an error correction mode if the width of the gap between the erased state voltage and the programmed state voltage is not larger than the first preset threshold value. In the error correction mode, the data read from the first memory cell is checked and corrected by the error checking and correcting circuit 908. For example, in the exemplary embodiment of FIG. 13, even thought the two states 1310 and 1320 are overlapped or very close, the error in the read data may be corrected in the error correction mode. In this exemplary embodiment, other programming modes (e.g., the 2LC programming mode, the 4LC programming mode, the 8LC programming mode and so on) excluding the error correction mode may not adopt any error correction process, so as to accelerate the speed of reading data. However, in another exemplary embodiment, the error correction mode is configured to adopt a stronger error correction process, and the other programming modes (e.g., the 2LC programming mode, the 4LC programming mode, the 8LC programming mode and so on) are configured to adopt a light error correction process. The error correction ability of the stronger error correction process is better than that of the light error correction process. For example, the stronger error correction process may include the iteration decoding process requiring huge computing resource, such as the low density parity code (LDPC) algorithm, the BCH algorithm and so on; while the light error correction process may include the non-iteration decoding process or any decoding algorithm requiring less computing resource. Accordingly, the speed of reading data may also be improved while the data reliability may be maintained.

In the above exemplary embodiment, the above analyzing and determining operations may be performed any time, such as in the manufacturing procedure or in the user end. For example, it may be performed by a testing device in the manufacturing procedure of the memory storage device 10. For example, it may be performed by the memory management circuit 902 after the factory. However, in another exemplary embodiment, the above analyzing and determining operations may be performed only when a usage degree of the first memory cell, a physical unit including the first memory cell or the rewritable non-volatile memory module 406 reaches a preset degree. The usage degree may be evaluated by any factor related to the reliability of the first memory cells. In an exemplary embodiment, the usage degree is presented by a usage degree value. The usage degree value is determined, for example, base on a read count, a write count, an erase count, an error bit number, an error bit rate, a data storage time duration or other factors related to the reliability of the first memory cell. For example, when the erase count of the first memory cell reaches 3000 times, the above analyzing and determining operations may be performed, so as to improve the reliability of the first memory cell; otherwise, while the erase count of the first memory cell does not reach 3000 times, the above analyzing and determining operations may not be performed, and the first memory cell is maintained to be operated in the first programming mode.

In another exemplary embodiment, the memory management circuit 902 may determine whether the width of said gap is larger than another preset threshold value (also known as a second preset threshold value). If the width of said gap is larger than the second preset threshold value, it indicates that the gap is wide enough, then the memory management circuit 902 does not perform the above analyzing and determining operations, and the first memory cell is maintained to be operated in the first programming mode. However, if the width of said gap is not larger than the second preset threshold value, the memory management circuit 902 continues to perform the above analyzing and determining operations. That is, in some exemplary embodiments, the above analyzing and determining operations may be determined to be performed according to said gap or said usage degree of the first memory cell.

In the present exemplary embodiment, after determining a specific programming mode that the first memory cell operated therein, the information indicating that the first memory cell not operated in the first programming mode is recorded in a management region of the rewritable non-volatile memory module 406. For example, the information may indicate the adopted programming modes of memory cells and/or the physical address of at least one of the memory cells and physical units adopting a new programming mode. However, the information recorded in the management region may also include any useful information, which is not limited here. The reliability of each of the memory cells in the management region may be higher than that of the first memory cell or any other memory cell not locating in the management region. For example, in the present exemplary embodiment, each of the memory cells in the management region is operated in the 2LC programming mode, so as to make sure the information recorded in the management region is accurate. The above information is read from the management region when the memory management circuit 902 is about to operate (e.g., writing data into the rewritable non-volatile memory module 406) the corresponding memory cells. In addition, in another exemplary embodiment, the above information may be recorded in the memory controlling circuit unit 404.

In an exemplary embodiment, the management region is disposed in each string and/or each page (i.e., physical page) of the rewritable non-volatile memory module 406. For example, it is assumed that the rewritable non-volatile memory module 406 includes M pages and N strings. Each page includes memory cells associating to a same word line. Each string includes memory cells associating to a same bit line. The total number of memory cells in an exemplary block of the rewritable non-volatile memory module 406 may be M×N. In this exemplary embodiment, Q memory cells in a specific string may be configured to record the information indicating the adopted programming mode of this string, where Q=$\log_2 Z$, and Z is the total number of possible programming modes which could be adopted. For example, if the total number of possible programming modes is 4 (e.g., ECC, 2LC, 3LC and 4LC), then Q may be set as 2. In addition, memory cells in the management region belonging to a specific page may be configured to record the information indicating the adopted programming mode of this page. Accordingly, if a specific page is to be programmed, then the information indicating the adopted programming mode of this page is first read, and the adopted programming mode of this page may be used to program this page.

In an exemplary embodiment, the total number of the Q memory cells may be evaluated as Q×(M+N). For example, those Q×(M+N) memory cells may be referred as the adaptive allocation memory usage. In order to record the above information (e.g., the information related to the adopted programming mode or the physical address of memory cells adopting new programming modes), the following equation (1.1) should be satisfied.

$$Q \times (M+N) < R_1 \times 2^Q \times MN \times M/2 \qquad (1.1)$$

In equation (1.1), $R_1$ is the probability that a memory cell is error in a string, and $R_1 \times 2^Q \times MN \times M/2$ is the number of removed cells by string-base error-correction (i.e., all memory cells belonging to a same string with error bit will be disposed). It is assumed that N is much larger that M, then equation (1.1) could be simplified as the following equation (1.2).

$$Q/2^{Q-1} < M^2 R_1 \qquad (1.2)$$

In this case, $R_1$ is also referred as $R_{bound}$. As M is increased, $R_{bound}$ is decreased. However, in another exemplary embodiment, in order to record the above information (e.g., the information related to the adopted programming mode or the physical address of memory cells adopting new programming modes), the following equation (2.1) should be satisfied.

$$Q \times (M+N) < R_2' 2^Q \times MN \qquad (2.1)$$

In equation (2.1), $R_2$ is the probability that a memory cell is error, and $R_2 \times 2^Q \times MN$ is the number of removed cells by cell-base error-correction (i.e., only memory cells being error will be eliminated). It is assumed that N is much larger that M, then equation (2.1) could be simplified as the following equation (2.2).

$$Q/2^Q < MR_2 \qquad (2.2)$$

In this case, $R_2$ is also referred as $R_{bound}$. As M is increased, $R_{bound}$ is decreased. Namely, as the number of memory cells belonging to a string of the rewritable non-volatile memory module 406 is increased, then the memory management method of this invention becomes more valid.

Figure 15:
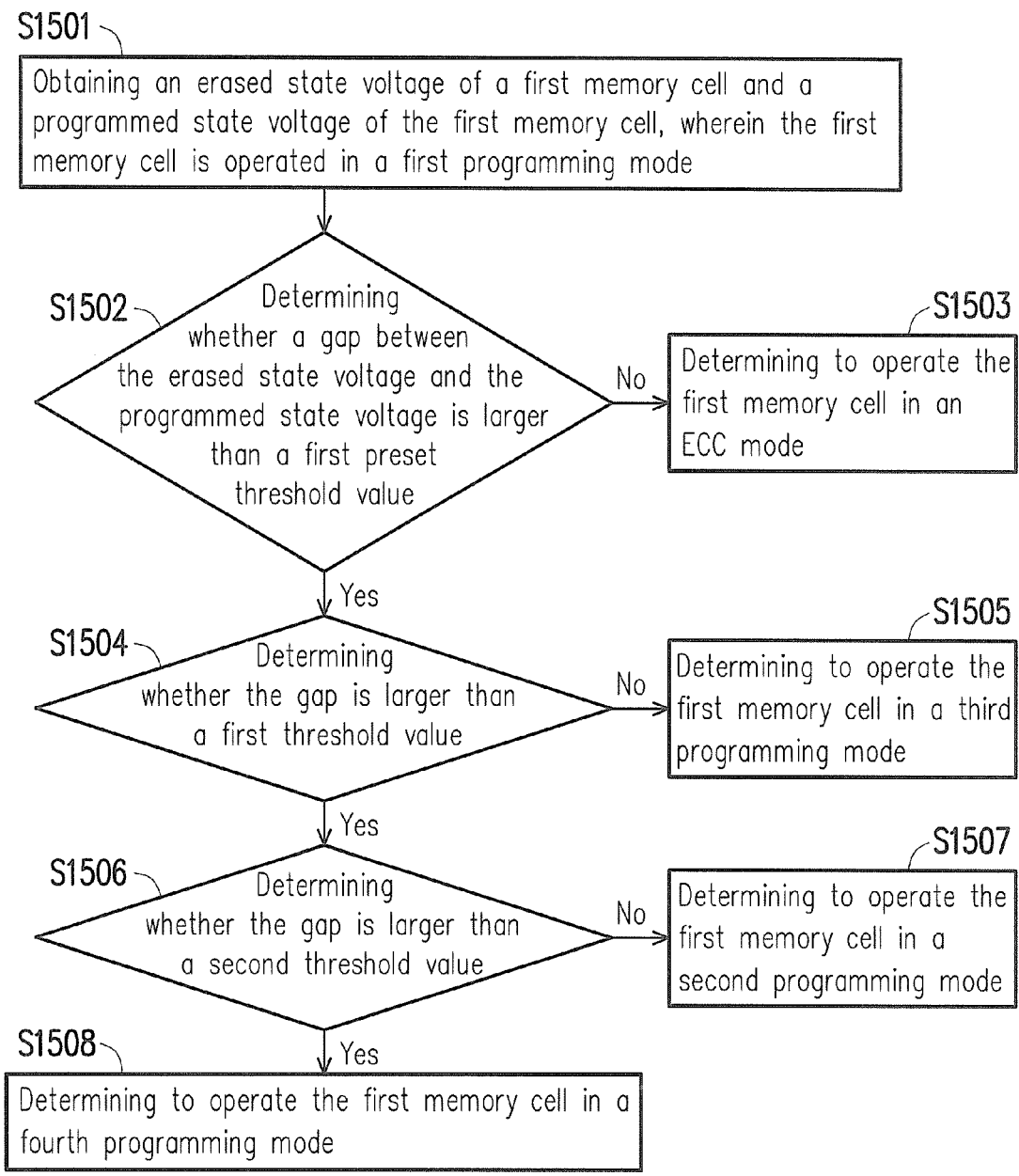
FIG. 15 is a flowchart illustrating a memory management method according to an exemplary embodiment of the invention.

FIG. 15 is a flowchart illustrating a memory management method according to an exemplary embodiment of the invention.

Referring to FIG. 15, it is assumed that a first memory cell in the rewritable non-volatile memory module 406 is originally designed to operate in a first programming mode, and the first programming mode is 4LC programming mode. In step S1501, an erased state voltage of the first memory cell and a programmed state voltage of the first memory cell are obtained. Here, the erased state voltage is referred as the most-erased state voltage, and the programmed state voltage is referred as the most-programmed state voltage, which is described above and related description is omitted hereafter. In step S1502, whether a gap (i.e., a width of the gap) between the erased state voltage and the programmed state voltage is larger than a first preset threshold value is determined. If the gap is not larger than the first preset threshold value, in step S1503, it is determined to operate the first memory cell in an error correction (ECC) mode. The ECC mode is described above and related description is omitted hereafter. If the gap is larger than the first preset threshold value, in step S1504, it is determined whether the gap is larger than a first threshold value. The first threshold value is larger than the first preset threshold value. If the gap is not larger than the first threshold value, in step S1505, it is determined to operate the first memory cell in a third programming mode. In the present exemplary embodiment, the third programming mode is the 2LC programming mode. If the gap is larger than the first threshold value, in step S1506, it is determined whether the gap is larger than a second threshold value which is larger than the first threshold value. If the gap is not larger than the second threshold value, in step S1507, it is determined to operate the first memory cell in a second programming mode. In the present exemplary embodiment, the second programming mode is the 3LC programming mode. If the gap is larger than the second threshold value, in step S1508, it is determined to operate the first memory cell in a fourth programming mode. In the present exemplary embodiment, the fourth programming mode is the 4LC programming mode. However, in another exemplary embodiment of FIG. 15, additional determination steps may be performed after the step S1506 if the original programming mode of the first memory cells is one of the 5LC programming mode to the 8LC programming mode or other programming mode. In addition, depending on different design, each of the adopted programming mode in the exemplary embodiment of FIG. 15 may be different, and each of the determination step S1502, S1504 and S1506 may be omitted. For example, in another exemplary embodiment of FIG. 15, the step S1502 is omitted, while the step S1504 is performed after the step S1501.

Figure 16:
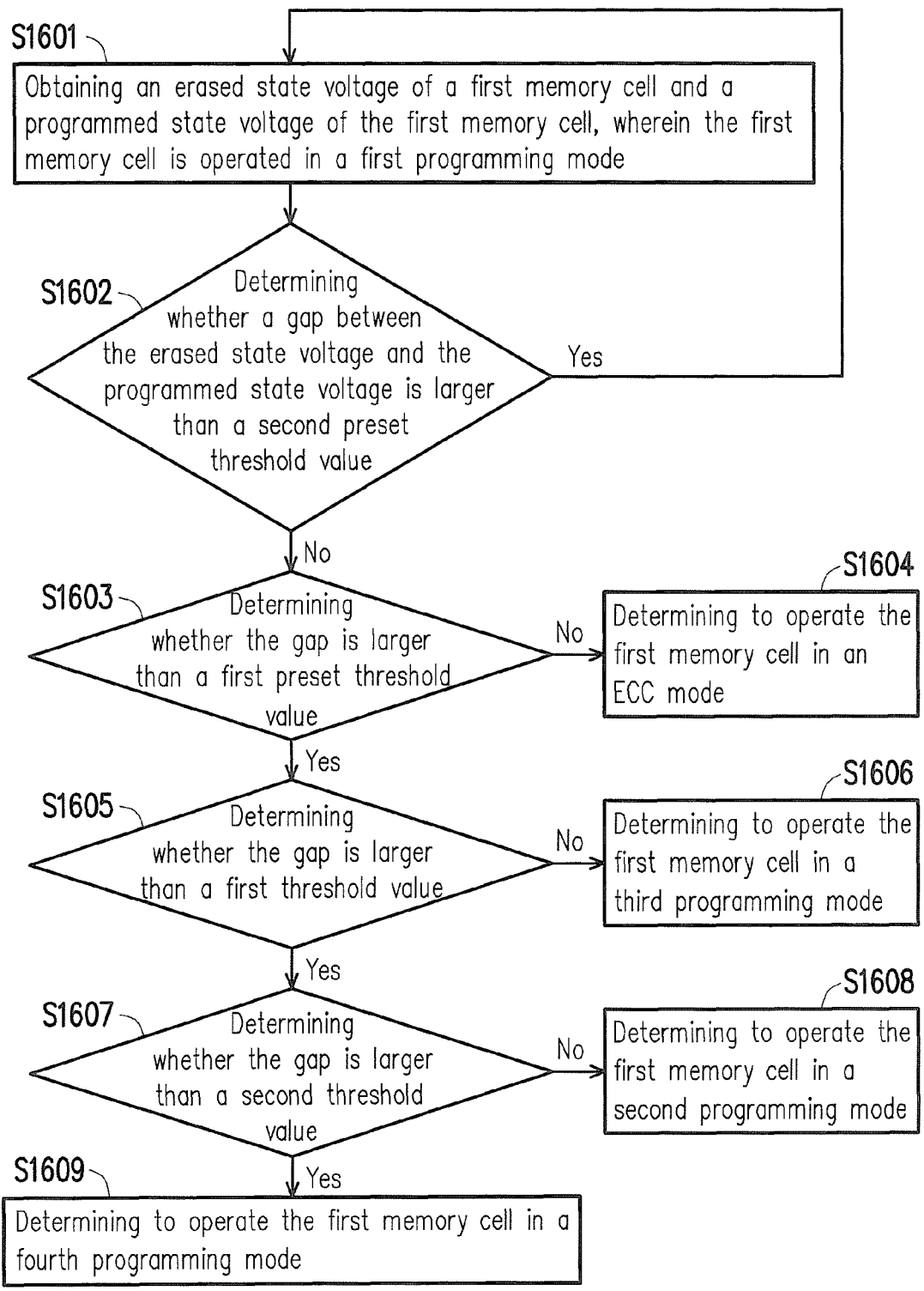
FIG. 16 is a flowchart illustrating a memory management method according to another exemplary embodiment of the invention.

FIG. 16 is a flowchart illustrating a memory management method according to another exemplary embodiment of the invention.

Referring to FIG. 16, it is assumed that a first memory cell in the rewritable non-volatile memory module 406 is originally designed to operate in a first programming mode, and the first programming mode is 4LC programming mode. In step S1601, an erased state voltage of the first memory cell and a programmed state voltage of the first memory cell are obtained. Here, the erased state voltage is referred as the most-erased state voltage, and the programmed state voltage is referred as the most-programmed state voltage, which is described above and related description is omitted hereafter. In step S1602, whether a gap between the erased state voltage and the programmed state voltage is larger than a second preset threshold value is determined. If the gap is larger than the second preset threshold value, the following steps are not performed. For example, the step S1601 may be performed again after the step S1602. If the gap is not larger than the second preset threshold value, in step S1603, whether the gap is larger than a first preset threshold value is determined. If the gap is not larger than the first preset threshold value, in step S1604, it is determined to operate the first memory cell in an ECC mode. The ECC mode is described above and related description is omitted here. If the gap is larger than the first preset threshold value, in step S1605, it is determined whether the gap is larger than a first threshold value. The first threshold value is larger than the first preset threshold value. If the gap is not larger than the first threshold value, in step S1606, it is determined to operate the first memory cell in a third programming mode. In the present exemplary embodiment, the third programming mode is the 2LC programming mode. If the gap is not larger than the first threshold value, in step S1607, it is determined whether the gap is larger than a second threshold value which is larger than the first threshold value. If the gap is not larger than the second threshold value, in step S1608, it is determined to operate the first memory cell in a second programming mode. In the present exemplary embodiment, the second programming mode is the 3LC programming mode. If the gap is larger than the second threshold value, in step S1609, it is determined to operate the first memory cell in a fourth programming mode. In the present exemplary embodiment, the fourth programming mode is the 4LC programming mode. However, in another exemplary embodiment of FIG. 16, the step S1602 may be replaced by the operation of determining whether a usage degree of the first memory cell reaches a preset degree. If the usage degree of the first memory cell reaches the preset degree, the following steps, such as the step S1603 and so on, are performed. If the usage degree of the first memory cell does not reach the preset degree, the following steps, such as the step S1603 and so on, are not performed.

However, each step of FIG. 15 and FIG. 16 has been described in detail above and will not repeated hereinafter. It should be noted that each of the steps illustrated in FIG. 15 and FIG. 16 may be implemented as a plurality of program codes or circuits, but construes no limitations to the present invention. Additionally, the methods illustrated in FIG. 15 and FIG. 16 may be implemented together with the exemplary embodiments above or may be performed solely, and the present invention is not limited thereto.

In summary, a specific programming mode is determined and configured to operate a specific memory cell based on which range the gap between the erased state voltage and the programmed state voltage of the specific memory cell locates. Accordingly, error bits contained in data read from the specific memory cell may be reduced and the lifetime of the rewritable non-volatile memory module may be extended.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed:

1. A memory management method for a rewritable non-volatile memory module comprising a plurality of memory cells, the memory cells comprise a first memory cell and a second memory cell, and the memory management method comprising:
obtaining a width of a first gap between an erased state voltage of the first memory cell and a programmed state voltage of the first memory cell, wherein the first memory cell is operated in a first programming mode;
obtaining a width of a second gap between an erased state voltage of the second memory cell and a programmed state voltage of the second memory cell, wherein the second memory cell is operated in the first programming mode;
operating the first memory cell in a second programming mode if it is determined that the width of the first gap is greater than a first threshold value, and operating the second memory cell in a third programming mode if it is determined that the width of the second gap is less than a first threshold value,
wherein a second number of a plurality of second states of the first memory cell operated in the second programming mode is less than or equal to a first number of a plurality of first states of the first memory cell operated in the first programming mode, and a third number of a plurality of third states of the second memory cell operated in the third programming mode is less than the second number.

2. The memory management method of claim 1, wherein the erased state voltage is a most-erased state voltage of the first memory cell, and the programmed state voltage is a most-programmed state voltage of the first memory cell,
wherein the step of obtaining the erased state voltage and the programmed state voltage comprises:
recording the most-erased state voltage after the first memory cell is erased; and
recording the most-programmed state voltage after the first memory cell is programmed.

3. The memory management method of claim 1, further comprises:
operating the first memory cell in a fourth programming mode if the gap between the erased state voltage and the programmed state voltage is larger than a second threshold value,
wherein the second threshold value is larger than the first threshold value,
wherein a fourth number of a plurality of fourth states of the first memory cell operated in the fourth programming mode is larger than the second number.

4. The memory management method of claim 3, further comprises:
operating the first memory cell in an error-correction mode if the width of the gap between the erased state voltage and the programmed state voltage is not larger than a first preset threshold value,
wherein the first preset threshold value is less than the first threshold value.

5. The memory management method of claim 1, further comprises:
determining whether the width of the gap between the erased state voltage and the programmed state voltage is larger than a second preset threshold value, wherein the second preset threshold value is larger than the first threshold value; and
determining whether the width of the gap between the erased state voltage and the programmed state voltage is larger than the first threshold value if the width of the gap is not larger than the second preset threshold value; and
maintaining to operate the first memory cell in the first programming mode and not performing the step of determining whether the width of the gap between the erased state voltage and the programmed state voltage is larger than the first threshold value if the width of the gap is larger than the second preset threshold value.

6. The memory management method of claim 1, further comprises:
recording information indicating the first memory cell not operated in the first programming mode in a management region of the rewritable non-volatile memory module.

7. The memory management method of claim 6, wherein a second reliability of the second memory cell in the management region is higher than a first reliability of the first memory cell.

8. A memory storage device, comprising:
a connection interface unit, configured to couple to a host system;
a rewritable non-volatile memory module comprising a plurality of memory cells, wherein the memory cells comprise a first memory cell and a second memory cell; and
a memory controlling circuit unit, coupled to the connection interface unit and the rewritable non-volatile memory module,
wherein the memory controlling circuit unit is configured to obtain a width of a first gap between an erased state voltage of a first memory cell and a programmed state voltage of the first memory cell, wherein the first memory cell is operated in a first programming mode,
wherein the memory controlling circuit unit is further configured to obtain a width of a second gap between an erased state voltage of the second memory cell and a programmed state voltage of the second memory cell, wherein the second memory cell is operated in the first programming mode,
wherein the memory controlling circuit unit is further configured to operate the first memory cell in a second programming mode if it is determined that the width of the first gap is greater than a first threshold value, and to operate the second memory cell in a third programming mode if it is determined that the width of the second gap is less than a first threshold value,
wherein a second number of a plurality of second states of the first memory cell operated in the second programming mode is less than or equal to a first number of a plurality of first states of the first memory cell operated in the first programming mode, and a third number of a plurality of third states of the second memory cell operated in the third programming mode is less than the second number.

9. The memory storage device of claim 8, wherein the erased state voltage is a most-erased state voltage of the first memory cell, and the programmed state voltage is a most-programmed state voltage of the first memory cell, wherein the operation of the memory controlling circuit unit obtaining the erased state voltage and the programmed state voltage comprises:
recording the most-erased state voltage after the first memory cell is erased; and
recording the most-programmed state voltage after the first memory cell is programmed.

10. The memory storage device of claim 8, wherein the memory controlling circuit unit is further configured to operate the first memory cell in a fourth programming mode if the gap between the erased state voltage and the programmed state voltage is larger than a second threshold value,
wherein the second threshold value is larger than the first threshold value,
wherein a fourth number of a plurality of fourth states of the first memory cell operated in the fourth programming mode is larger than the second number.

11. The memory storage device of claim 10, wherein the memory controlling circuit unit is further configured to operate the first memory cell in an error-correction mode if the width of the gap between the erased state voltage and the programmed state voltage is not larger than a first preset threshold value,
wherein the first preset threshold value is less than the first threshold value.

12. The memory storage device of claim 8, wherein the memory controlling circuit unit is further configured to determine whether the width of the gap between the erased state voltage and the programmed state voltage is larger than a second preset threshold value, wherein the second preset threshold value is larger than the first threshold value,
wherein the memory controlling circuit unit is further configured to determine whether the width of the gap between the erased state voltage and the programmed state voltage is larger than the first threshold value if the width of the gap is not larger than the second preset threshold value,
wherein the memory controlling circuit unit is further configured to maintain to operate the first memory cell in the first programming mode and does not perform the operation of determining whether the width of the gap between the erased state voltage and the programmed state voltage is larger than the first preset threshold value if the width of the gap is larger than the second preset threshold value.

13. The memory storage device of claim 8, wherein the memory controlling circuit unit is further configured to record information indicating the first memory cell not operated in the first programming mode in a management region of the rewritable non-volatile memory module.

14. The memory storage device of claim 13, wherein the second reliability of a second memory cell in the management region is higher than a first reliability of the first memory cell.

15. A memory controlling circuit unit, configured to control a rewritable non-volatile memory module, and the memory controlling circuit unit comprising:
a host interface, configured to couple to a host system;
a memory interface, configured to couple to the rewritable non-volatile memory module, wherein the rewritable non-volatile memory module comprises a plurality of memory cells, and the memory cells comprises a first memory cell and a second memory cell; and
a memory management circuit coupled to the host interface and the memory interface,
wherein the memory management circuit is configured to obtain a width of a first gap between an erased state voltage of a first memory cell and a programmed state voltage of the first memory cell, wherein the first memory cell is operated in a first programming mode,
wherein the memory management circuit is further configured to obtain a width of a second gap between an erased state voltage of the second memory cell and a programmed state voltage of the second memory cell, wherein the second memory cell is operated in the first programming mode,
wherein the memory management circuit is further configured to operate the first memory cell in a second programming mode if it is determined that the width of the first gap is greater than a first threshold value, and to operate the second memory cell in a third programming mode if it is determined that the width of the second gap is less than a first threshold value,
wherein a second number of a plurality of second states of the first memory cell operated in the second programming mode is less than or equal to a first number of a plurality of first states of the first memory cell operated in the first programming mode, and a third number of a plurality of third states of the second memory cell operated in the third programming mode is less than the second number.

16. The memory controlling circuit unit of claim 15, wherein the erased state voltage is a most-erased state voltage of the first memory cell, and the programmed state voltage is a most-programmed state voltage of the first memory cell,
wherein the operation of the memory management circuit obtaining the erased state voltage and the programmed state voltage comprises:
recording the most-erased state voltage after the first memory cell is erased; and
recording the most-programmed state voltage after the first memory cell is programmed.

17. The memory controlling circuit unit of claim 15, wherein the memory management circuit is further configured to operate the first memory cell in a fourth programming mode if the gap between the erased state voltage and the programmed state voltage is larger than a second threshold value,
wherein the second threshold value is larger than the first threshold value,
wherein a fourth number of a plurality of fourth states of the first memory cell operated in the fourth programming mode is larger than the second number.

18. The memory controlling circuit unit of claim 17, wherein the memory management circuit is further configured to operate the first memory cell in an error-correction mode if the width of the gap between the erased state voltage and the programmed state voltage is not larger than a first preset threshold value,
wherein the first preset threshold value is less than the first threshold value.

19. The memory controlling circuit unit of claim 15, wherein the memory management circuit is further configured to determine whether the width of the gap between the erased state voltage and the programmed state voltage is larger than a second preset threshold value, wherein the second preset threshold value is larger than the first threshold value,
wherein the memory management circuit is further configured to determine whether the width of the gap between the erased state voltage and the programmed state voltage is larger than the first threshold value if the width of the gap is not larger than the second preset threshold value, wherein the memory management circuit is further configured to maintain to operate the first memory cell in the first programming mode and does not perform the operation of determining whether the width of the gap between the erased state voltage and the programmed state voltage is larger than the first threshold value if the width of the gap is larger than the second preset threshold value.

20. The memory controlling circuit unit of claim 15, wherein the memory management circuit is further configured to record information indicating the first memory cell not operated in the first programming mode in a management region of the rewritable non-volatile memory module.

21. The memory controlling circuit unit of claim 20, wherein a second reliability of the second memory cell in the management region is higher than a first reliability of the first memory cell.

* * * * *